United States Patent [19]
Gray et al.

[11] Patent Number: 5,411,409
[45] Date of Patent: May 2, 1995

[54] COMPONENT MOUNTING ARRANGEMENT

[75] Inventors: Ian J. S. Gray, Nr. Winchester; Peter J. Brumwell, Portsmouth, both of United Kingdom

[73] Assignee: ITT Corporation, New York, N.Y.

[21] Appl. No.: 232,902

[22] Filed: Apr. 25, 1994

[30] Foreign Application Priority Data

Apr. 30, 1993 [GB] United Kingdom ............ 9308960

[51] Int. Cl.$^6$ ............................................. H01R 13/62
[52] U.S. Cl. ............................. 439/329; 439/63; 439/581
[58] Field of Search ........................ 439/326–329, 439/248, 252, 63, 581, 825, 324

[56] References Cited

U.S. PATENT DOCUMENTS

| | | | |
|---|---|---|---|
| 2,444,048 | 6/1948 | Keller | 439/252 |
| 2,863,131 | 12/1958 | Carlzen et al. | 439/252 |
| 4,684,200 | 8/1987 | Capp | 439/63 |
| 4,846,719 | 7/1989 | Iwashita | 439/63 |
| 5,076,804 | 12/1991 | Bertho et al. | 439/567 |
| 5,088,937 | 2/1992 | Gabany | 439/581 |
| 5,112,249 | 5/1992 | Henry et al. | 439/581 |
| 5,122,075 | 6/1992 | Kile | 439/329 |
| 5,167,531 | 12/1992 | Broschard, III et al. | 439/540 |
| 5,190,474 | 3/1993 | Ginet | 439/581 |

FOREIGN PATENT DOCUMENTS

| | | |
|---|---|---|
| 0181305 | 11/1985 | European Pat. Off. |
| 0469845 | 7/1991 | European Pat. Off. |
| 0820318 | 12/1955 | United Kingdom |
| 8804840 | 6/1988 | WIPO |

Primary Examiner—David L. Pirlot
Attorney, Agent, or Firm—Thomas L. Peterson

[57] ABSTRACT

A mounting arrangement is provided for mounting a coaxial connector (1) on a circuit board (2). The connector has an inner conductor (6) with a downwardly projecting pin portion (9) and has an outer conductor (40) with downwardly extending conductive legs (10–13) arranged in a circle (42). The circuit board has a center hole (17) for receiving the pin portion, and has a circle of outer holes (14–18) for receiving the legs. The pin portion (9) is offset a distance (X) from alignment with the board center hole (17), so an enlargement (44) of the pin portion is deflected as it enters the board center hole. In the final position, a shoulder (20) on the enlargement abuts a lower board surface (46).

14 Claims, 3 Drawing Sheets

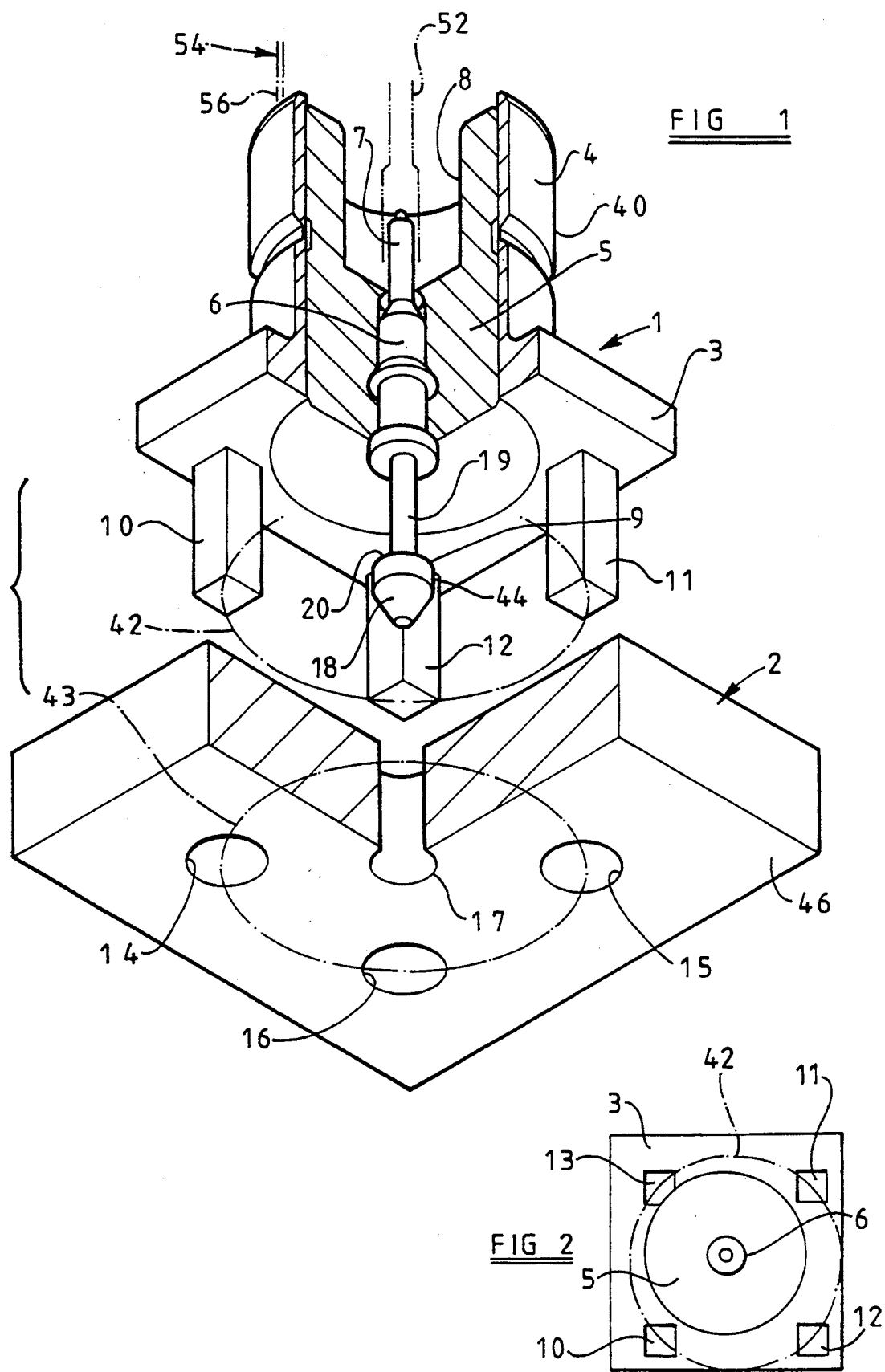

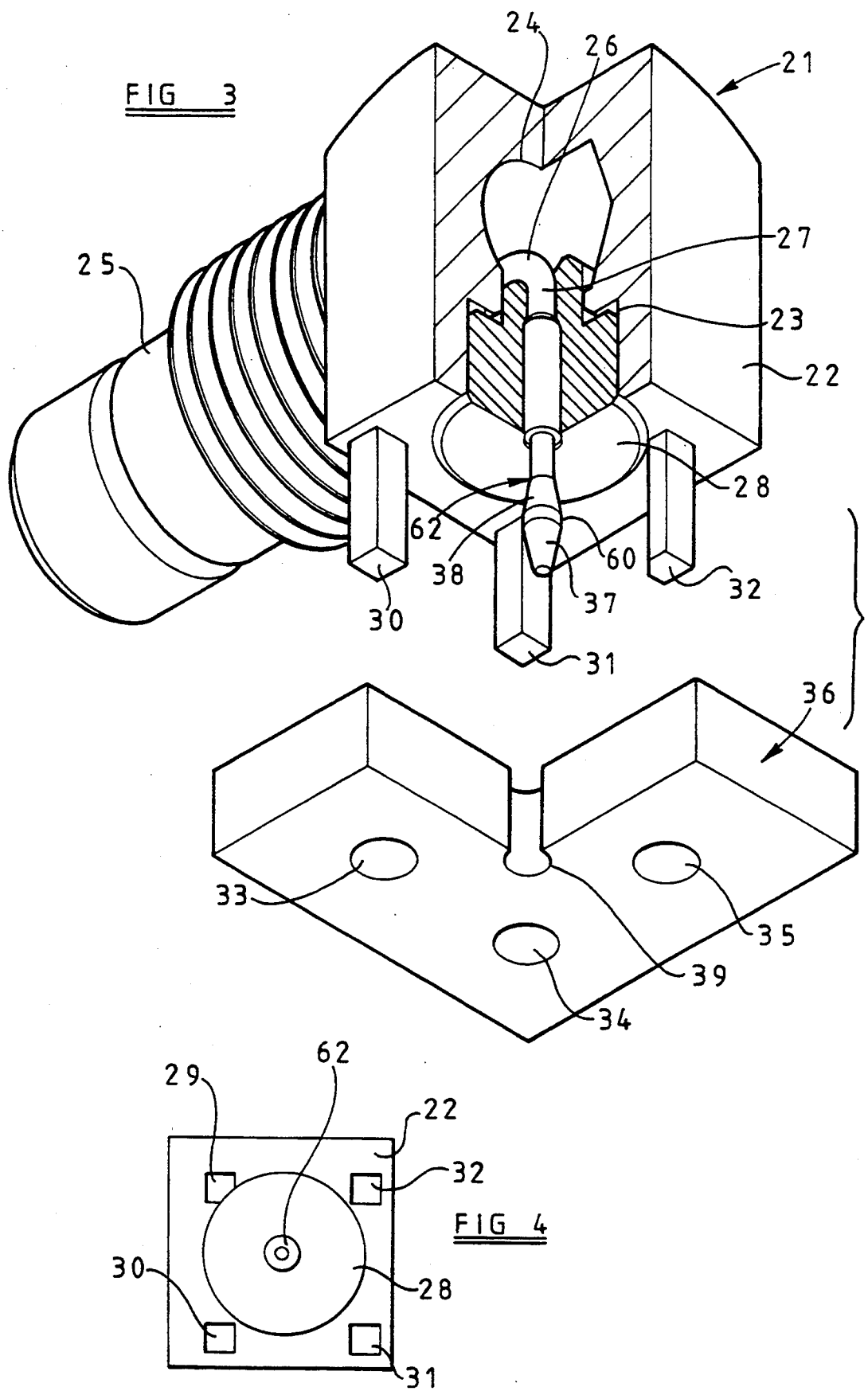

COMPONENT MOUNTING ARRANGEMENT

BACKGROUND OF THE INVENTION

This invention relates to component mounting arrangements for the secure mounting of electrical components on printed or wiring circuit boards prior to the automatic soldering of the components to such boards.

The present invention is especially applicable to the secure mounting of a coaxial electrical connector or other component on a circuit board, prior to soldering the terminals of the connector to conductive traces of the board. Such connector may comprise terminals that can project down through plated-through holes in the circuit board for subsequent soldering thereto. It is important that the electrical component be securely mounted on the board to prevent dislodgement prior to soldering.

It has been proposed to form the terminal legs of a connector with barbs which bite into the plating of the board holes. However, the plating of the holes may be damaged by the barbs, particularly in view of manufacturing tolerances that result in variations in the plated hole and/or barb dimensions. Moreover, the barbs make it difficult to remove the unsoldered connector from the board without damage to the plated through-holes. Removal may be necessary if the wrong connector is mounted, or if the connector is mounted at a wrong location on the board.

DESCRIPTION OF THE PREFERRED EMBODIMENT

In accordance with one embodiment of the present invention, a mounting arrangement is provided for securely mounting an electrical component on a circuit board prior to soldering it in place, especially a coaxial component. The component includes at least one contact with a downwardly projecting portion in the form of a pin that enters a center hole in the circuit board. The component also has a grounded outer conductor or shell with a plurality of downwardly extending legs for entering outer holes in the circuit board. The pin is positioned so it is sidewardly, or horizontally, deflected as it passes through the center hole. In the fully installed position, a shoulder on the pin presses against the lower surface of the circuit board to hold the component in place prior to soldering.

The pin has a cone-shaped enlarged head portion or enlargement at its free lower end. Where the circuit board is of a standard thickness, the top end of the cone shaped portion has an upwardly facing annular shoulder that abuts the lower surface of the circuit board. Where the circuit board is of non-standard thickness, the cone-shaped portion of the pin may be preceded by an oppositely-tapered conical section which forms a partially upwardly facing shoulder to abut the lower surface of the circuit board.

The novel features of the invention are set forth with particularity in the appended claims. The invention will be best understood from the following description when read in conjunction with the accompanying drawings.

BRIEF DESCRIPTION OF THE DRAWINGS

FIG. 1 is an exploded, sectional and bottom isometric view of a coaxial electrical connector and circuit board of the present invention.

FIG. 2 is a diagrammatic bottom view of the connector of FIG. 1, shown prior to installation on the circuit board.

FIG. 3 is an exploded, sectional and bottom isometric view of a coaxial connector of another embodiment of the invention.

FIG. 4 is a diagrammatic bottom view of the connector of FIG. 3.

DESCRIPTION OF THE PREFERRED EMBODIMENTS

Figure 1A:
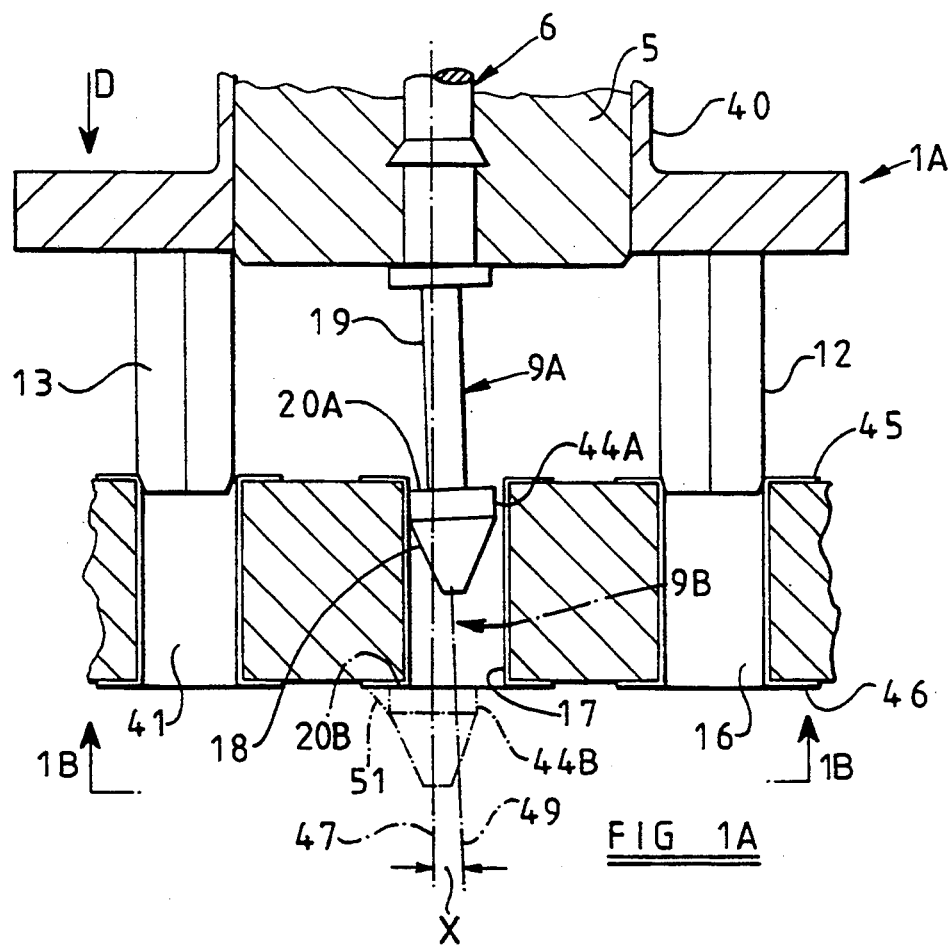
FIG. 1A is a sectional side view of the connector and circuit board of FIG. 1, shown in solid lines in the course of installation, and shown in phantom lines after installation.

FIG. 1 shows a coaxial electrical connector 1 that is designed to mount on a circuit board 2. The connector includes inner and outer conductors 6, 4 and a dielectric or insulator 5 between them. The outer conductor or shell, includes a square base 3 and an integral upstanding hollow part 40 extending upward therefrom and having a substantially cylindrical inside. The inner conductor 6 is support by the insulator. The upper end 7 of the inner conductor 6 projects into a cavity 8 in the insulator where it is electrically connected to the central conductor 52 of a coaxial cable 54, with the external braiding 56 of the cable being electrically connected to the outer conductor 4 of the connector.

Figure 1B:
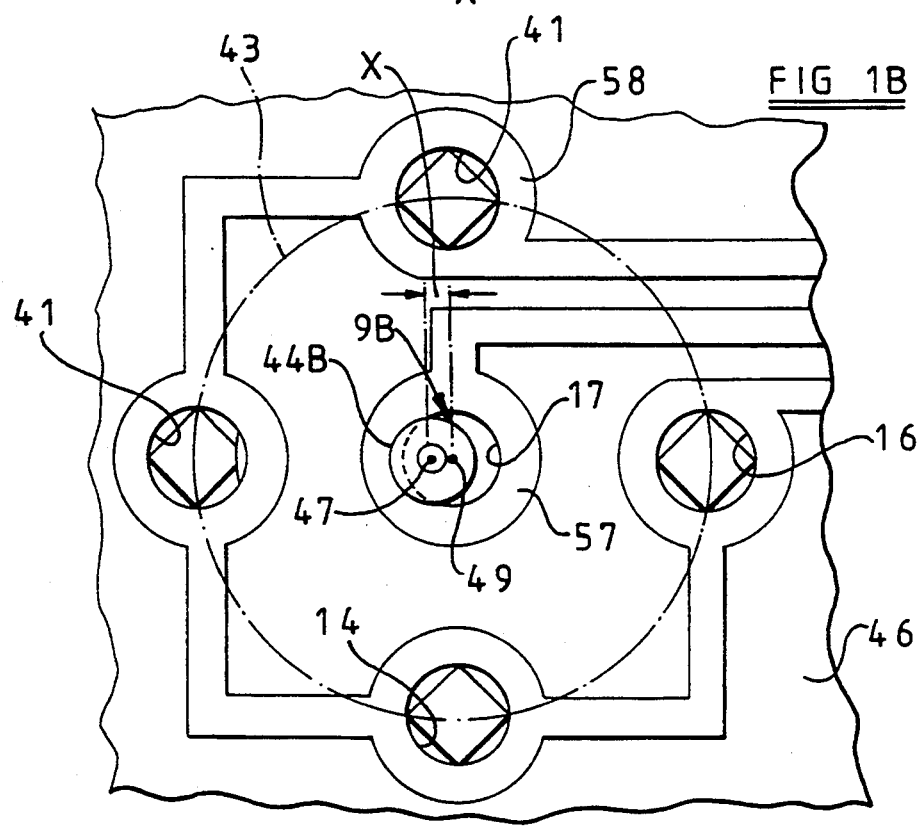
FIG. 1B is a view taken on line 1B—1B of FIG. 1A, after installation of the connector.

The inner conductor 6 has a downwardly projecting lower pin portion 9 that projects down below the insulator 5 and the base 3. The base 3 has four metal terminal legs 10, 11, 12 and 13 that also project down. As shown in FIG. 2, the legs lie on an imaginary circle 42. Each of the legs is shown as being of square cross-section, although one leg 13 is cutaway, but other cross-sections can be used. The legs are designed to closely fit slidingly into four plated-through outer circuit board holes 14, 15, 16 and 41 (FIG. 1B). The circuit board also has a center plated-through hole 17 for receiving the inner conductor lower portion 9. The outer holes 14, 15, 16 and 41 have centers that lie on an imaginary circle 43, and the outer holes are arranged to slideably receive the legs 10–13.

In accordance with the invention, the axis 47 of the undeflected lower projecting portion as shown at 9 (FIG. 1) and 9B (FIGS. 1A and 1B) of the inner conductor is offset slightly, by a distance X, from the center 49 of the circle 43 on which the legs 10–13 are arranged. The distance X is preferably at least 10% of the diameter of the enlargement 44 and of the center hole 17. As a result of the offset, the projecting lower portion 9 of the inner conductor must be sidewardly, or horizontally, deflected at 9A (FIG. 1A) to enter the center hole 17 in the circuit board. At final installation at 9B, the axis 47 of the lower portion of the inner conductor is offset from the axis 49 of the circuit board center hole 17 and of the circle 43 of outer holes.

The downwardly-projecting lower portion 9 of the inner conductor 6 has an enlargement 44 that forms a cone-shaped head portion 18 and an upwardly facing shoulder 20. The cone shaped portion 18 is downwardly tapered to be progressively narrower at progressively lower locations. As the connector is lowered in the down direction D, to the position 1A in FIG. 1A, the cone-shaped portion 18 deflects the lower portion of the center conductor to the position 9A. Such deflection is partially due to deflection of the elastomeric insulator 5, and partially due to deflection of a stem 19 of the inner conductor lower portion. An elastomeric material such as rubber, has a Young's modulus of elasticity that is usually less than 10,000 psi. As the connector reaches its fully installed position, the enlargement snaps to the position shown at 44B, wherein the shoulder 20B lies under the circuit board lower surface 46, at one side of the center hole. The shoulder 20B then prevents upward movement of the connector out of the board, unless the enlargement at 44B is sidewardly deflected. In the fully installed position, the insulator and/or base 3 lies against the upper surface 45 of the board. Thus, the connector is held in place until the conductors are soldered to the circuit board traces. Solder is indicated at 51.

As shown in FIG. 1B, traces 57, 58 of metal such as gold-plated copper, lie on the lower surface of the circuit board around and in the board holes. The traces 58 are electrically grounded, while the trace 57 carries signals to other parts of the circuit board.

The use of a conical head portion at 18 (FIG. 1A), which is substantially symmetrical about a vertical axis, has advantages over the provision on an enlargement at only one side. An important advantage is that this avoids the need to mount the inner conductor 6 at a given orientation about its axis in the insulator. The provision of circuit board holes that are evenly spaced and that lie on a circle 43 that is concentric with the center hole 17, facilitates the layout and drilling of the center and outer holes. Also, with the four holes shown, the connector can be installed at any of four orientations.

FIGS. 3 and 4 illustrate another embodiment of the invention which includes a coaxial connector 21 with an outer conductor or shell body 22. The body has two perpendicular, generally cylindrical cavities 23 and 24. The cavity 24 lies in a body part 25. The connector includes a center conductor or pin 26 which has a part 27 lying with an insulator 28. The connector has four terminal legs 29, 30, 31 and 32 which are shown as being of largely square cross section, as can best be seen in FIG. 4. The terminal legs project in parallel directions downwardly from the rest of the body 22 and define a square terminal leg array (they lie on the corners of a square). The terminal legs are designed to be slidingly received by corresponding plated-through holes, three of which are shown at 33, 34 and 35, in a circuit board 36.

As will be readily appreciated, the connector 21 is weighted on one side by the body part 25 and therefore has a tendency to tilt. Such tilt would cause partial withdrawal of at least two of the terminal legs from their respective circuit board holes, prior to soldering.

To avoid tilting of the connector 21, the center conductor or pin 26 is provided with a lower portion 62 having an enlargement 60 that has a downward tapered cone-shaped head portion 37. The head portion 37 is similar to that of the FIG. 1 embodiment, in that the head portion 37 and the rest of the lower portion 62 is offset so it is sidewardly deflected as it enters a center circuit board hole 39. However, the lower portion of the pin has an oppositely tapered conical section 38 lying immediately above or preceding the head portion 37. The section 18 is upwardly tapered, in that it is progressively narrower at progressively higher locations. This permits retention of the connector despite variations in the thickness of the printed circuit board 36.

The circuit board 36 has a centrally-disposed plated-through hole 39 for receiving the lower portion 62 of the pin. To mount the connector 21 on the board, terminal legs 29–32 of the outer conductor are moved into registration with corresponding plated-through holes such as 33–35. Downward force is applied to the connector so the tapered end 37 of the enlargement 60 enters the hole 39. Due to the pin lower part 62 being offset from the center of the terminal leg square array, as can be seen in FIG. 4, the pin lower portion 62 will be deflected to one side as it enters the hole 39. Such deflection is against the resilience of the pin metal and/or the resilience of the material of the insulator 28.

After the tapered head portion 37 emerges from the bottom of the plated through-hole 39, the oppositely tapered portion 38 allows the pin lower part to return partially toward its original vertical orientation. The pin enlargement 60 is progressively restored towards its original position as it moves progressively down. In this embodiment of the invention, the restoration of the pin is gradual and does not provide a snap action. However, the oppositely or upwardly tapered section 38 does tend to hold the connector in place, in circuit boards of varying thicknesses.

The secure mounting arrangement of the invention is especially applicable to the secure mounting of coaxial connectors having central terminal pins and dependent terminal legs, to circuit boards. However, the arrangement can be applied to the secure mounting of other electrical components to printed circuit boards prior to soldering of the components of the boards. In the case of noncoaxial components, more than one pin can lie within a grounded shell.

While terms such as "vertical", "horizontal", etc. have been used to help describe the invention and its parts as illustrated, it should be understood that the connector end circuit board can be used in any orientation with respect to the earth's gravity.

Thus, the invention provides an electrical component and a combination of it with a circuit board, which is constructed to hold the component in place prior to soldering it in place. The circuit board has a center hole and has a plurality of outer holes lying in a circle about the center hole. The connector has a shell or outer conductor with a plurality of rigid legs, preferably arranged in a second circle concentric with said first circle and the center hole, to slide into the outer circuit board holes. The connector also has a pin conductor or contact with a downwardly extending lower portion. The pin lower portion lies on an axis that is offset so the lower portion can enter the center hole of the circuit board only when the lower portion is sidewardly deflected. The lower portion has an enlargement with a shoulder facing at least partially upwardly. As a result, at full installation the shoulder presses against the lower surface of the circuit board to resist removal or tilt the connector. In one connector, the shoulder faces directly up to snap into position and prevent removal until sidewardly deflected. In another connector, the shoulder is formed on a downwardly tapered portion that resists upward movement with a moderate force.

Although particular embodiments of the invention have been described and illustrated herein, it is recognized that modifications and variations may readily occur to those skilled in the art, and consequently, it is intended that the claims be interpreted to cover such modifications and equivalents.

We claim:

1. A combination of a coaxial electrical component that includes a grounded outer conductor and a substantially coaxial inner conductor and an insulator between said conductors, and a circuit board with upper and lower surfaces, wherein:
   a said circuit board has a center hole with a first conductive trace thereat for connection to said coaxial inner conductor, and has a plurality of outer holes spaced about said center hole and with a least one electrically grounded trace at one of said outer holes;
   said coaxial inner conductor has a downwardly projecting portion that projects through said center hole and that is electrically connected to said first conductive trace, and said outer conductor has a plurality of downwardly projecting legs that each projects into one of said outer holes, with at least one of said legs electrically connected to said grounded trace;
   said downwardly projecting portion of said coaxial inner conductor has a lower part with an enlargement that lies at least partially under said circuit board and that forms a shoulder with a shoulder surface facing at least partially upwardly and that substantially bears against said lower surface of said circuit board, with said legs being positioned so when they are received in said outer holes said legs urge said downwardly projecting portion of said coaxial inner conductor toward a position out of alignment with said center hole to urge said shoulder toward one side of said center hole.

2. The combination described in claim 1 wherein:
   said insulation comprises elastomeric material, to facilitate horizontal deflection of said downwardly projecting part of said inner conductor.

3. The combination described in claim 1 wherein:
   said outer holes lie on a first imaginary circle and said legs lie on a second imaginary circle that is concentric with said first imaginary circle;
   said lower portion of said coaxial inner conductor downwardly projecting portion, is spaced a distance (X) from said axes of said imaginary circles.

4. The combination described in claim 3 wherein:
   said lower portion of said coaxial inner conductor has a substantially conical lower end that is of progressively smaller diameter at progressively lower locations, said conical lower end extending below said shoulder.

5. The combination described in claim 3 wherein:
   said lower portion of said coaxial inner conductor has an upwardly tapered section that is of progressively smaller diameter at progressively higher locations and that forms said shoulder.

6. A coaxial electrical component which can mount on a circuit board that has a center hole for receiving an inner coaxial conductor, and a plurality of outer holes lying on a circle that is centered on said center hole for receiving parts of an outer conductor, wherein the component includes a conductive outer coaxial conductor with a part having a cylindrical inner surface, an insulator lying within said outer conductor part and having a substantially vertical passageway, and an inner conductor lying in said passageway and having a lower portion extending downwardly along a first vertical axis below said insulator to project through said circuit board center hole, said inner conductor lower part having a lower portion with an enlargement having a shoulder surface that faces at least partially in an upward direction to press against the bottom of the circuit board and resist upward movement out of the board, characterized by:
   said outer conductor has at least three legs projecting downwardly below said insulator to project into said outer holes of the circuit board, said legs being spaced about an imaginary circle which has a second axis that is horizontally spaced from said first axis of said inner conductor lower portion, to cause sideward deflection of said enlargement on said inner conductor lower portion as said enlargement passes through said circuit board center hole.

7. The component described in claim 6 wherein:
   said second axis is spaced from said first axis by at least 10% of the diameter of said enlargement.

8. The component described in claim 6 wherein:
   said inner conductor has a substantially conical lower end extending below said shoulder and tapered in a downward direction.

9. The component described in claim 6 wherein:
   said inner conductor has a substantially conical section that is of progressively smaller diameter at progressively higher locations, and that forms said shoulder.

10. The component described in claim 6 wherein:
    said insulation is formed primarily of elastomeric material.

11. A combination of an electrical component and a circuit board that has a center hole and at least three outer holes lying on an imaginary circle that surrounds and is concentric with said center hole, wherein said component comprises:
    a housing having at least three legs projecting into said outer holes of said circuit board;
    an insulator lying within said housing and having a passageway said insulator having a lower end;
    a contact lying in said passageway and having a lower pin portion extending downwardly below said insulator and projecting through said center hole in said circuit board, said lower portion having a lower part forming an enlargement with a shoulder surface that faces at least partially in an upward direction and that presses against the bottom of the circuit board to resist its upward movement out of the board, said contact lower portion lying on a substantially vertical axis which is horizontally displaced from the center of said imaginary circle.

12. The combination described in claim 11 wherein:
    said enlargement comprises a substantially conical lower end lying below said shoulder.

13. The combination described in claim 12 wherein:
    said enlargement faces upwardly, to snap under said circuit board.

14. A method for mounting an electrical component having inner and outer coaxial conductors and an insulator therebetween on a circuit board, comprising:
    forming a center hole in said board and a plurality of outer holes in said board that lie on an imaginary first circle that extends around and is centered on said center hole;
    forming said outer conductor with a plurality of legs lying on an imaginary second circle that can be positioned concentric with said first circle to enter said outer holes, and forming said inner conductor with an elongated pin-shaped lower portion with a lower end that has an enlargement that forms a largely upwardly facing shoulder and a tapered lower end, said enlargement being offset from the center of said second circle;

pressing said component down toward said circuit board, including projecting said pin-shaped lower portion into said center hole, and including deflecting said enlargement horizontally in a first direction as it first enters said hole and then allowing said enlargement to deflect in an opposite direction as said pin moves further down.

* * * * *